United States Patent [19]

Liu et al.

[11] Patent Number: 5,049,517
[45] Date of Patent: Sep. 17, 1991

[54] METHOD FOR FORMATION OF A STACKED CAPACITOR

[75] Inventors: Yauh-Ching Liu; Pierre Fazan; Hiang Chan; Howard E. Rhodes; Charles H. Dennison, all of Boise, Id.

[73] Assignee: Micron Technology, Inc., Boise, Id.

[21] Appl. No.: 612,402

[22] Filed: Nov. 7, 1990

[51] Int. Cl.$^5$ .............................................. H01L 21/70
[52] U.S. Cl. .......................................... 437/52; 437/47;
437/48; 437/60; 437/228; 437/233; 437/235;
437/919
[58] Field of Search ................. 437/47, 48, 51, 52,
437/60, 191, 193, 195, 228, 233, 235, 919;
357/236, 51

[56] References Cited

U.S. PATENT DOCUMENTS

| 4,953,126 | 8/1990 | Ema | 357/23.6 |
|---|---|---|---|
| 5,021,357 | 6/1991 | Taguchi et al. | 437/919 |

FOREIGN PATENT DOCUMENTS

| 0058254 | 5/1981 | Japan . |
| 0042161 | 2/1989 | Japan . |
| 1-87847 | 7/1989 | Japan . |

OTHER PUBLICATIONS

T. Ema et al., "3-Dimensional Stacked Capacitor Cell For 16M and 64M DRAMS", IEDM Tech. Digest, pp. 592, 595, 1988.

S. Inoue et al., "A Spread Stacked Capacitor (SSC) Cell For 64MBIT DRAMS", IEDM Tech. Digest, pp. 31-34, 1989.

Primary Examiner—Brian E. Hearn
Assistant Examiner—Tom Thomas
Attorney, Agent, or Firm—Wells, St. John & Roberts

[57] ABSTRACT

A method is disclosed for forming a capacitor on a semiconductor wafer which utilizes top and back sides of a capacitor node for capacitance maximization. First and second dielectric layers, having different etch rates, are applied atop the wafer, and a contact opening is etched therethrough. Poly is applied and etched to begin formation of one node of the capacitor. A layer of oxide is then formed atop the poly capacitor node. The first dielectric layer is then etched, leaving a projecting or floating capacitor node which is surrounded by the second dielectric material and oxide formed thereatop. The surrounding material is then etched, the capacitor dielectric applied, and the poly of the second capacitor nod applied and selectively etched.

27 Claims, 5 Drawing Sheets

METHOD FOR FORMATION OF A STACKED CAPACITOR

TECHNICAL FIELD

This invention relates generally to three dimensional stacked capacitors and fabrication thereof.

BACKGROUND OF THE INVENTION

As DRAMs increase memory cell density, there is a continuous challenge to maintain a sufficiently high storage capacitance despite decreasing cell area. A principle way of increasing cell density is through cell structure techniques. Such techniques include three dimensional cell capacitors such as trenched or stacked capacitors.

With a conventional stacked capacitor, the capacitor is formed immediately above and electrically connected to the active device area of the associated MOS transistor of the memory cell. Typically, only the upper surface of storage polysilicon node of the capacitor is utilized for capacitance. However, some attempts have been made to provide construction whereby the backside of one capacitor terminal is used to store charge. Such is shown by way of example by T. Ema et al., "3-Dimensional Stacked Capacitor Cell For 16M And 64M DRAMS" IEDM Tech. Digest, pp. 592-595, 1988 and S. Inoue et al., "A Spread Stacked Capacitor (SSC) Cell For 64MBIT DRAMS", IEDM Tech Digest, pp. 31-34, 1989.

The article by Ema et al. discloses a construction for 16 and 64 megabit DRAMs. FIGS. 1 and 11 from this article illustrate a vertically rising capacitor construction having a plurality of fins, both sides of which are utilized for stored capacitance. The article to Inoue et al. utilizes spread for the horizontal area for a three dimensional stacked capacitor construction. Both such process significantly add processing steps over conventional techniques for creation of three dimensional stack cell capacitors, and require that tight tolerances be adhered to in contact alignment.

It would be desirable to improve upon these and other processes to enable utilization of opposing sides or faces of the node or terminals of three dimensional stacked capacitors.

BRIEF DESCRIPTION OF THE DRAWINGS

The preferred embodiment of the invention is described with reference to the accompanying drawings, in which:

More specifically, FIG. 2 is a diagrammatic section as described above at one processing step of a processing method in accordance with the invention.

FIG. 3 is a diagrammatic section of a substrate wafer at a processing step subsequent to that illustrated by FIG. 2 using a processing method in accordance with the invention.

FIG. 4 is a diagrammatic section of a substrate wafer at a processing step subsequent to that illustrated by FIG. 3 using a processing method in accordance with the invention.

FIG. 5 is a diagrammatic section of a substrate wafer at a processing step subsequent to that illustrated by FIG. 4 using a processing method in accordance with the invention.

FIG. 6 is a diagrammatic section of a substrate wafer at a processing step subsequent to that illustrated by FIG. 5 using a processing method in accordance with the invention.

FIG. 7 is a diagrammatic section of a substrate wafer at a processing step subsequent to that illustrated by FIG. 6 using a processing method in accordance with the invention.

FIG. 8 is a diagrammatic section of a substrate wafer at a processing step subsequent to that illustrated by FIG. 7 using a processing method in accordance with the invention.

FIG. 9 is a diagrammatic section of a substrate wafer at a processing step subsequent to that illustrated by FIG. 8 using a processing method in accordance with the invention.

FIG. 10 is a diagrammatic section of a substrate wafer at a processing step subsequent to that illustrated by FIG. 9 using a processing method in accordance with the invention.

FIG. 11 is a diagrammatic section of a substrate wafer at a processing step subsequent to that illustrated by FIG. 10 using a processing method in accordance with the invention.

FIG. 12 is a diagrammatic section of a substrate wafer at a processing step subsequent to that illustrated by FIG. 11 using a processing method in accordance with the invention.

FIG. 13 is a diagrammatic section of a substrate wafer at a processing step subsequent to that illustrated by FIG. 12 using a processing method in accordance with the invention.

DETAILED DESCRIPTION OF THE PREFERRED EMBODIMENTS

The following disclosure of the invention is submitted in furtherance with the constitutional purpose of the Patent Laws "to promote the progress of science and useful arts" (Article 1, Section 8).

In accordance with one aspect of the invention, a method of forming a capacitor on a semiconductor wafer comprises the following steps:

forming an electrically conductive interconnect line on the wafer, the interconnect line having side and top portions;

electrically isolating the substantial side and top portions of the interconnect line by forming one or more electrically insulating layers about the side and top portions;

forming a first dielectric layer over the wafer atop the substantially insulated interconnect line, the first dielectric layer having a first etch rate;

forming a second dielectric layer over the wafer atop the first dielectric layer, the second dielectric layer having a second etch rate which is slower than the first etch rate;

selectively etching contact openings through the first and second dielectric layers to align with selective active areas on the wafer;

applying an electrically conductive material atop the wafer, the electrically conductive material engaging the active areas within the contact openings;

selectively etching the applied electrically conductive material and the second dielectric layer down to the first dielectric layer to begin formation of a first terminal of a capacitor, the first capacitor terminal rising above and over the interconnect line;

forming an oxide layer atop the electrically conductive material to enable texturizing of a top of the first capacitor terminal to increase capacitance, the oxide layer having an etch rate which is slower than the first etch rate;

etching the first dielectric layer to project the first capacitor terminal above the interconnect line to expose a bottom as well as top and side portions of the first capacitor terminal above the interconnect line;

etching the oxide layer and remaining second dielectric layer from the projecting first capacitor terminal;

forming a third dielectric layer over the exposed top, bottom and side portions of the exposed and etched projecting first capacitor terminal; and applying an electrically conductive material atop the third dielectric layer to form a second terminal of the capacitor.

Figure 1:
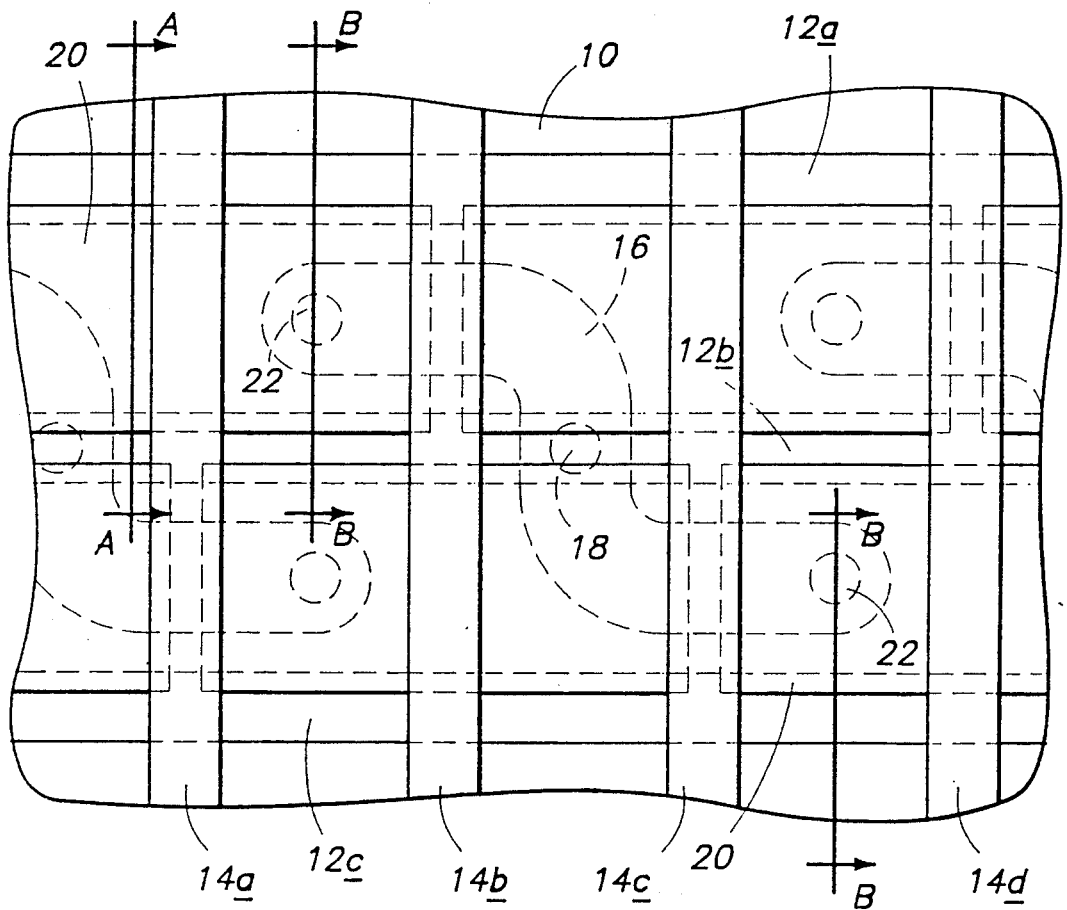
FIG. 1 is a top plan depiction of a portion of a semiconductor chip produced by a process in accordance with the invention.

More specifically, and with reference to the figures, FIG. 1 illustrates a top plan view of a portion of a DRAM array. Illustrated is a wafer fragment 10 comprised of a series of bit or digit lines 12a, 12b, 12c and word lines 14a, 14b, 14c, and 14d. The rough Z-like shaped encircled area 16 denotes the common active drain area between a pair of transistors, which connects to bit line 12b by a contact 18. Wafer fragment 10 also has a pair of capacitors 20 which electrically connect to active area 16 via buried contacts 22.

Figure 2:
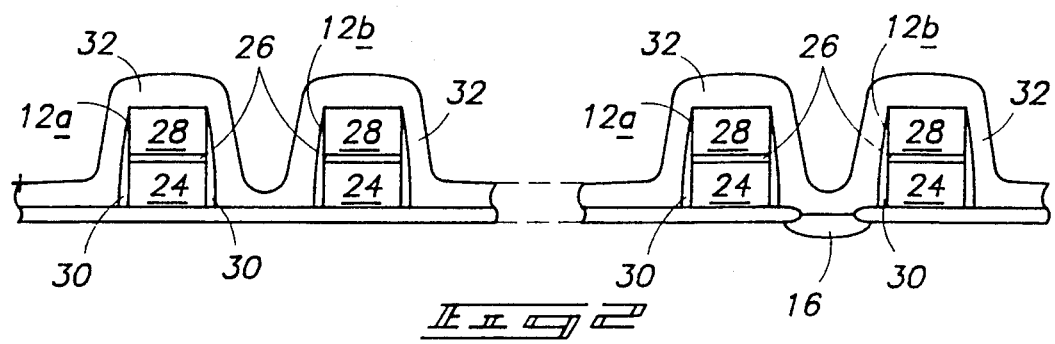
FIGS. 2-13 are each left and right pairs of cross-sectional views of a portion of a semiconductor wafer processed in accordance with the invention at one particular step in the inventive process. The left portion of each of FIGS. 2-13 depicts a view through cross-sectional line A—A in FIG. 1 throughout the process, while the right-hand portions of FIGS. 2-13 depict cross-sectional views taken through either of lines B—B of FIG. 1.

A description for producing such a construction proceeds first with reference to FIG. 2. Electrically conductive interconnecting bit or digit lines 12a and 12b are first formed. Lines 12a and 12b are illustrated as having a conventional sandwich construction, each having a doped polysilicon section 24 and an overlying region 26 comprised of a higher conducting material than polysilicon, such as $WSi_x$. The top of the more conductive section 26 is covered by an electrically isolating layer 28 of oxide. The sides of digit lines 12a, 12b have insulating oxide spacers 30 formed thereabout. Construction of digit lines 12a, 12b can be of any conventional technique, and does not constitute part of the invention.

After formation of bit lines 12a, 12b, a first dielectric layer 32 is formed over the wafer atop the insulated bit lines 12a, 12b. First dielectric layer 32 should have some known, selected etch rate for reasons which will become apparent with the continuing discussion. An example suitable material for the first dielectric layer is $Si_3N_4$. Such can be applied by known low pressure chemical vapor deposition techniques (LPCVD).

Figure 3:
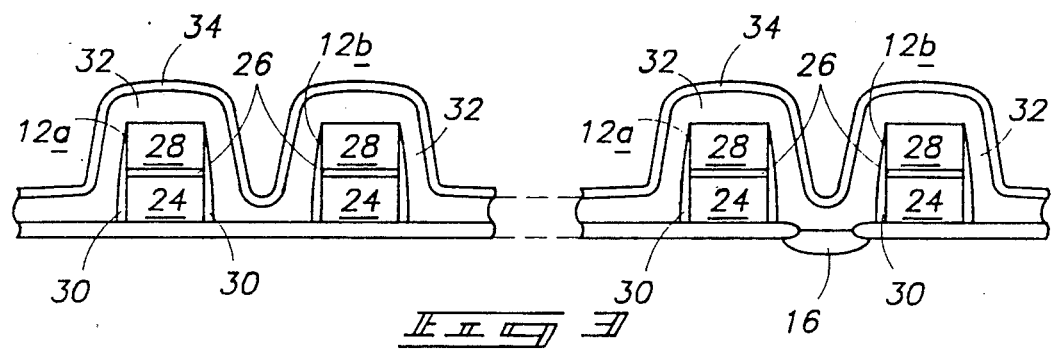

Referring to FIG. 3, a second dielectric layer 34 is formed over the wafer atop first dielectric layer 32. Second dielectric layer 34 should be of a material having a second etch rate which is slower than the first etch rate of the first dielectric material, for reasons which will become apparent from the continuing discussion. One example of a suitable dielectric material would be tetraethylorthosilicate (TEOS), a form of silicon dioxide, which can be deposited by known techniques at 650° C. to 750° C. in an LPCVD process by decomposing tetrathoxysilane, $Si(OC_2H_5)_4$. The applied TEOS should be densified, such as by heating at 900° C. for approximately 5 minutes, to provide a TEOS layer having an etch rate which is significantly slower than the etch rate of the first dielectric layer. The thickness of the first dielectric layer will typically be greater than the thickness of the second dielectric layer. A typical thickness of the first dielectric layer would be approximately 1000 Angstroms, while a typical thickness of the second dielectric layer would be approximately 700 Angstroms. The thickness of first layer 32 should be sufficient to space a capacitor node to be formed above insulating oxide portion 28 of bit lines 12a and 12b, as will become apparent from the continuing discussion. The first and second dielectric layers should have a combined thickness which is less than the defined distance between adjacent digit lines.

Figure 4:
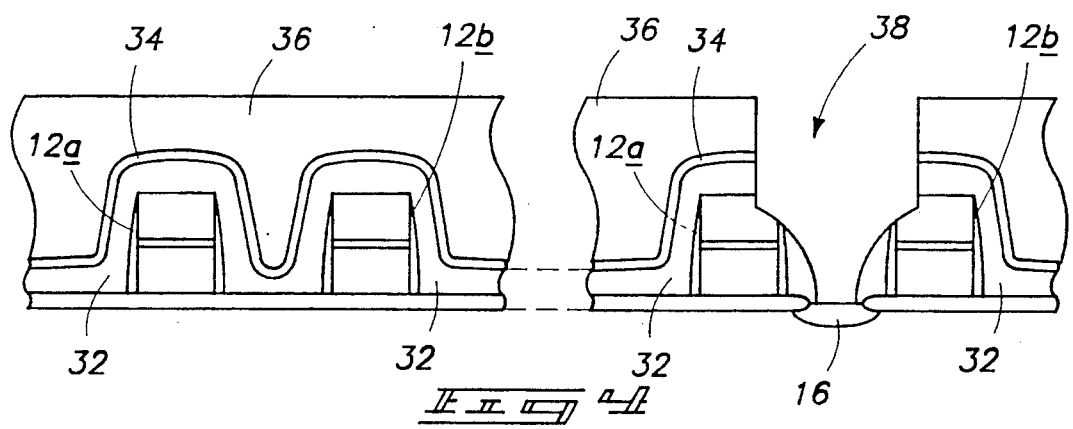

Referring to FIG. 4, a layer of photoresist 36 is applied and selectively exposed, and thereafter etched to provide a contact opening 38 through first and second dielectric layers 32, 34 respectively, to align with selective active areas 16 on the wafer. Contact openings 38 will be used to form the buried contacts 22 illustrated in FIG. 1. (Certain numbers inserted for indication in FIGS. 2 and 3 are removed for clarity in FIG. 4 and the remaining figures.)

Figure 5:
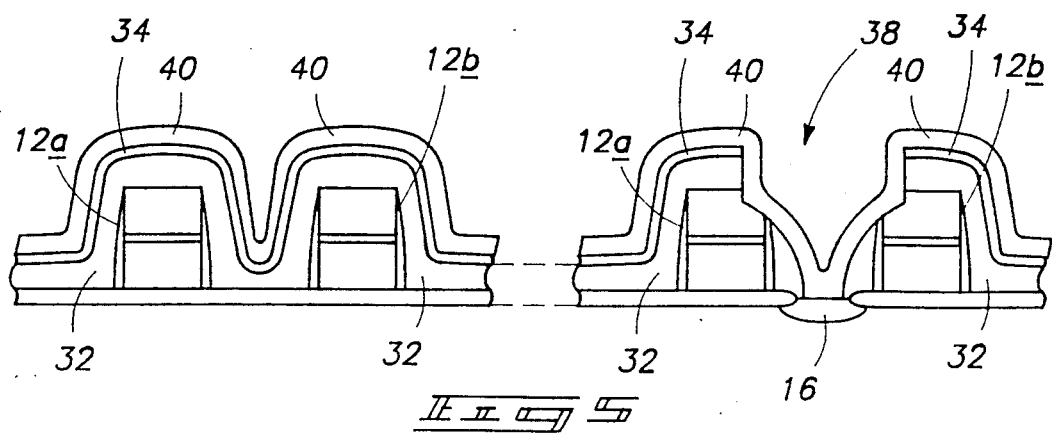

Referring to FIG. 5, the photoresist layer is stripped and an electrically conductive material thereafter applied atop the wafer to effectively fill contact openings 38 and contact or otherwise engage active area 16 therewithin. The preferred material for layer 40 is conductively doped polysilicon. Layer 40 will ultimately be utilized to form the first terminal of the cell capacitor.

Figure 6:
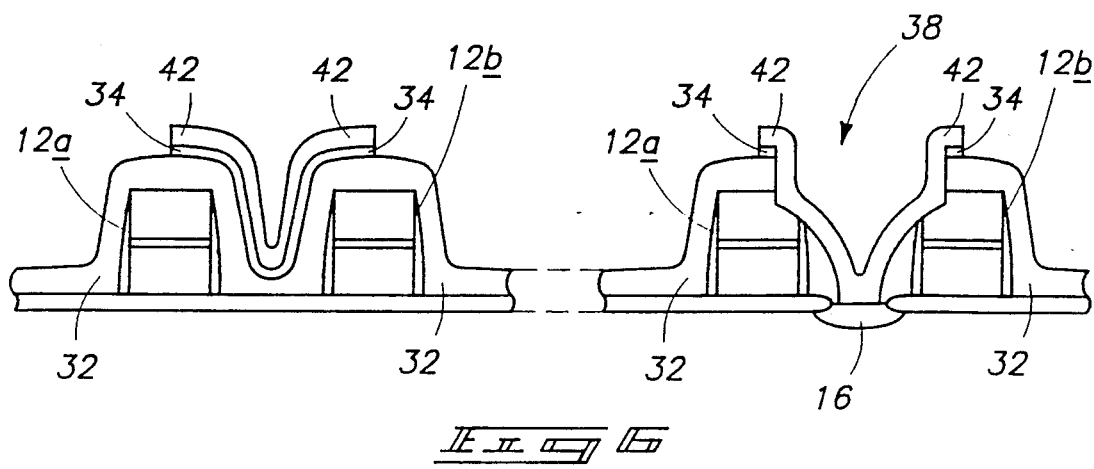

Referring to FIG. 6, electrically conductive layer 40 has been patterned with photoresist and selectively etched, along with etching of exposed portions of second dielectric layer 34. The etching is stopped at the upper surface of first dielectric layer 32. This serves to begin formation of what will be a first terminal 42 of the cell capacitor. First capacitor terminal 42 rises from between adjacent digit lines 12a and 12b and extends above and over such digit lines, as shown.

Figure 7:
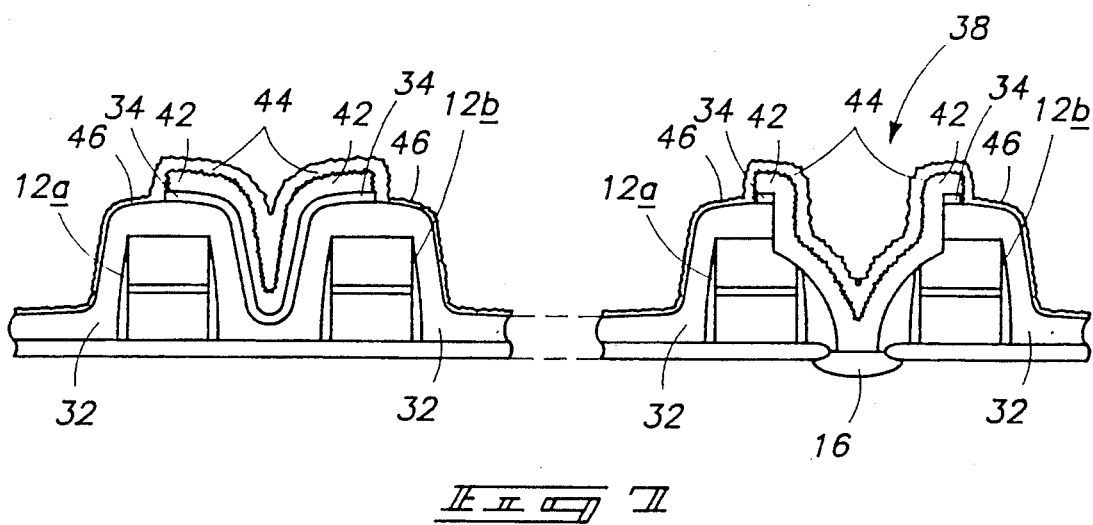

Referring to FIG. 7, a layer 44 of oxide is formed atop capacitor first terminal 42 for etching protection, as will be apparent from the continuing discussion. Formation of oxide layer 44 will also serve to texturize the top of first capacitor terminal 42 to maximize exposed surface area and thereby increase capacitance, as will be explained subsequently. Formed oxide layer 44 will have an etch rate which is significantly slower than the first etch rate of the material of first dielectric layer 32. During formation of oxide layer 44, an oxide layer 46 would typically also naturally be formed atop the exposed first dielectric layer 32. However, the oxide layer 46 atop first dielectric layer 32 will have a thickness which is much less than the thickness of oxide layer 44 atop first capacitor terminal 42. For example, the preferred thickness of oxide layer 44 would be between 500 and 700 Angstroms, which would typically form oxide layer 46 on first dielectric layer 32 to only about 20 Angstroms. As illustrated, oxide will also form about the opposing side edges of first capacitor terminal 42.

Figure 8:
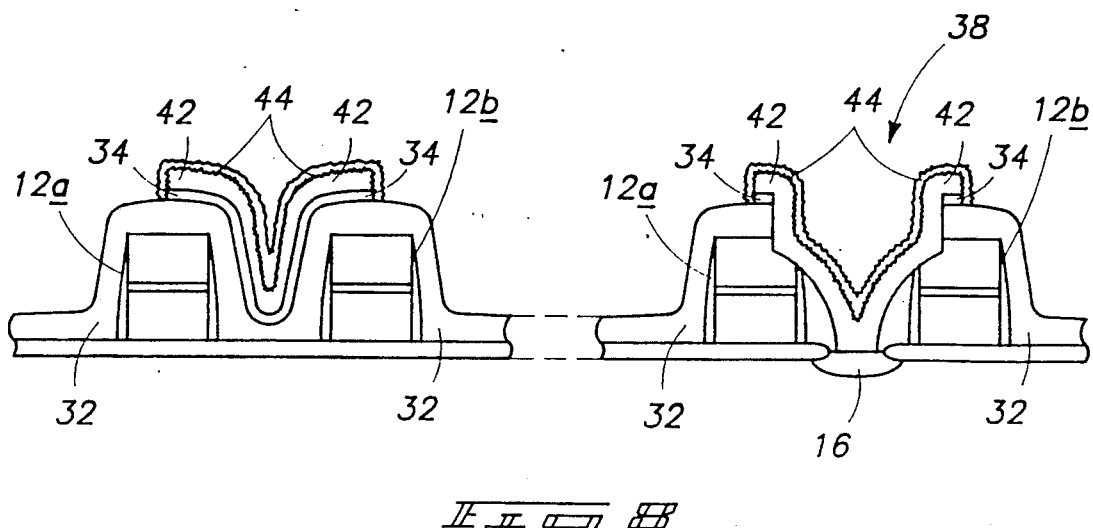

Referring to FIG. 8, thin oxide layer 46 would then typically be wet etched by a quick oxide dip in, for example, a solution of HF. An example solution would be a 100 volume parts water to 1 volume HF solution, with the etching of layer 46 being conducted over two minutes with the solution temperature being held at approximately 22° C. Alternately, a wet buffered oxide enchant could be used, for example a 7 to 1 volume ratio of NH4F in a 49% (by volume) HF solution. The latter would produce much faster etching, for example approximately 5 seconds at a solution temperature of approximately 22° C. The goal is to remove the oxide layer forming atop first dielectric layer 32.

Figure 9:
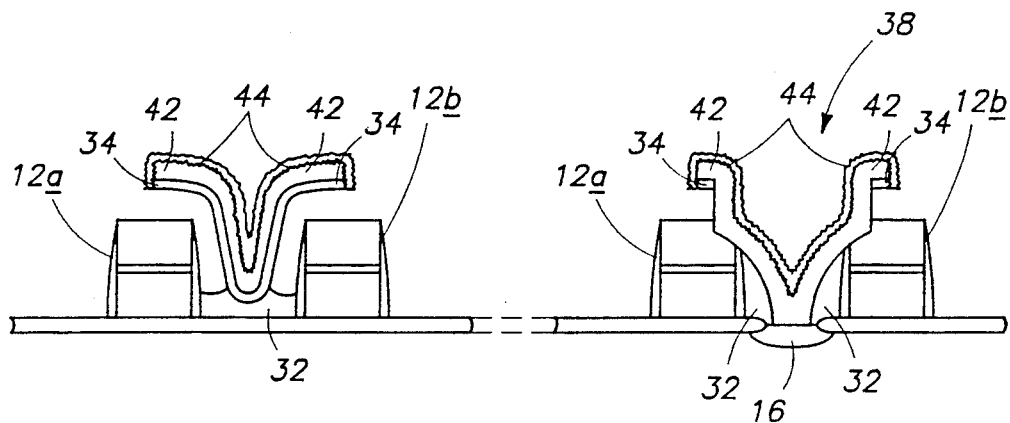

Next, referring to FIG. 9, first dielectric layer 32 is substantially etched to project first capacitor terminal 42 above adjacent digit lines 12a, 12b. This will expose the bottom (through layer 34) as well as the top (through layer 44) and side portions of first capacitor terminals 42 above the digit lines, as illustrated. The reason for different etch rates of first and second dielectric layers 32, 34 respectively, will now be apparent. As illustrated in FIG. 9, the underside of first capacitor terminal 42 remains protected during etch of first dielectric layer 32 by second dielectric material 34. The sides and upper portions of first capacitor terminal 42 are protected by the formed oxide layer 44 during etch of first dielectric layer 32. Layer 44 and second layer 34 function, at least in part, to protect the polysilicon of first capacitor terminal 42 from being etched during etching of first layer 32 to expose the underside portions of first capacitor terminal 42. Accordingly to provide such a function, layers 44 and 34 need be of a material which has a slower etch rate than that of first layer 32. An example etching step for an Si$_3$N$_4$ first dielectric layer 32 would be with an H$_3$PO$_4$ solution at a temperature in excess of 130° C.

Figure 10:
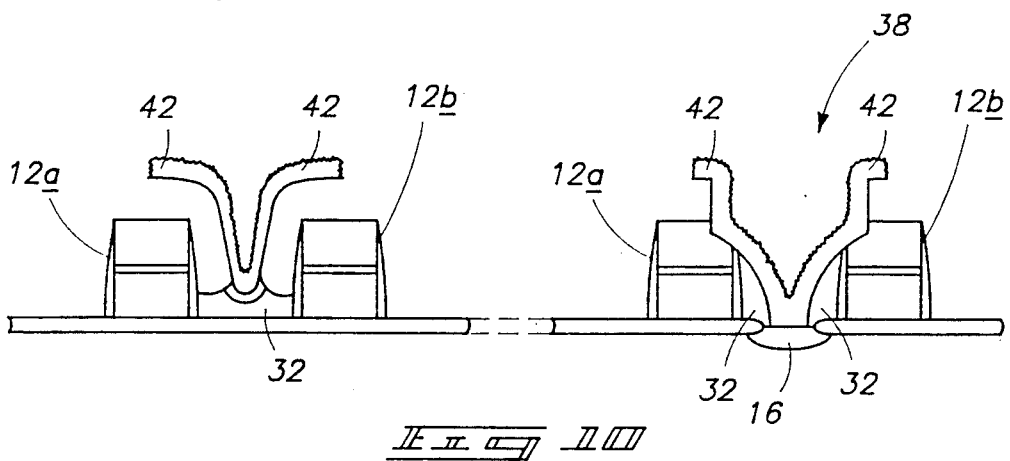

Referring to FIG. 10, oxide layer 44 and remaining second layer 34 are etched using conventional techniques from about projecting first capacitor terminal 42 to expose the electrically conductive material of terminal 42. The formation and subsequent removal of layer 44 about the tops and sides of first capacitor terminal 42 functions to texturize or roughen such surfaces, which is known within the art to increase surface area and thereby increase capacitance. Removal of underlying layer 34 will not function to texturize the underside of first capacitor terminal 42, as the polysilicon which was applied to form capacitor terminal 42 occurred after formation of second layer 34. From the construction illustrated by FIG. 10, a dielectric layer could next be applied, followed by a poly or other conductive material deposition and patterning to fully form the stacked capacitor utilizing both sides of first capacitor terminals 42. Alternately, and more preferred, would be subsequent steps which would also texturize the underside of first capacitor terminal 42 to further maximize the capacitance thereof.

Figure 11:
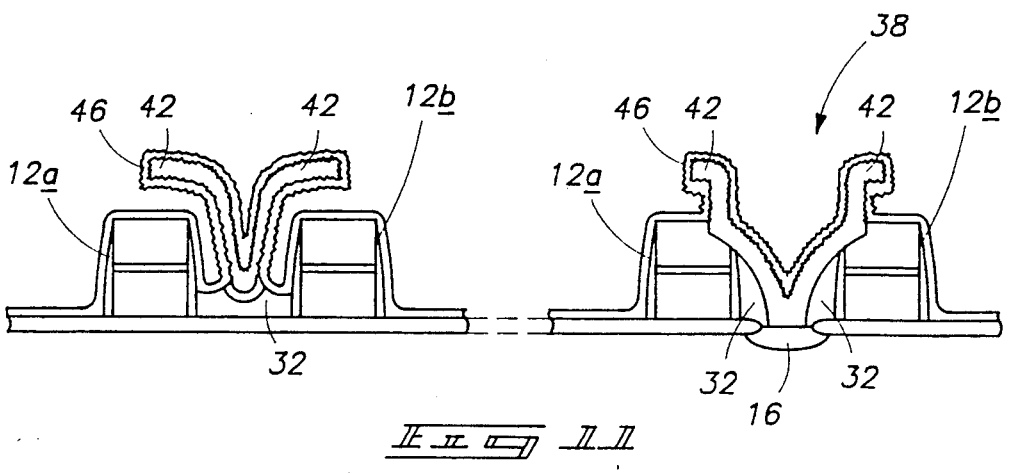

The discussion continues with the more preferred process and with reference to FIG. 11. Here, an oxide layer 46 is formed about projecting first capacitor terminal 42 as shown. Formation of oxide layer 46 as illustrated will function to texturize the remaining exposed portions of projecting first capacitor terminal 42.

Figure 12:
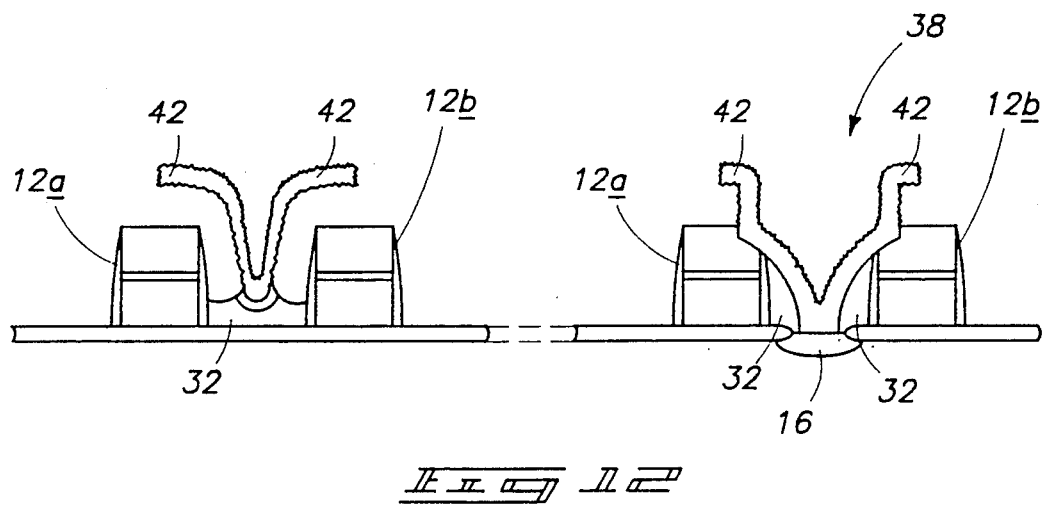

Referring to FIG. 12, oxide layer 46 is thereafter etched from first capacitor terminal 42 to effectively texturize the bottom portion of first capacitor 42.

Figure 13:
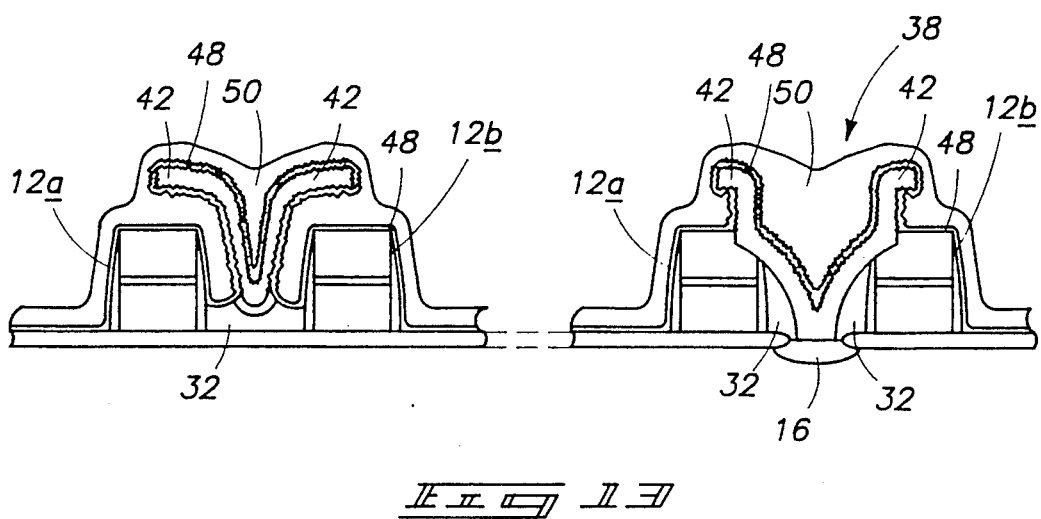

Referring to FIG. 13, a third dielectric layer 48, such as Si$_3$N$_4$, is formed over the exposed top, bottom and side portions of exposed and etched projecting first capacitor terminal 42. Layer 48 would typically be approximately 100 Angstroms thick. Electrically conductive material, such as doped polysilicon, would then be applied atop third dielectric layer 48 to form a layer 50. Layer 50 would typically be approximately 2000 Angstroms thick. Layer 50 would then be selectively patterned and etched to produce the second capacitor plates having dimensions corresponding to that depicted diagrammatically for capacitor 20 in FIG. 1.

Texturizing both sides of the first capacitor node 42 as described above may provide a global capacitance increase of as much as 250% as compared to conventional stacked cell capacitors employing only one side of a poly node. The above described process achieves this without any addition of photomasking steps to conventional processing which uses only one side of a capacitor node, and merely adds two wet etch steps and two oxide steps.

The disclosure was made principally with reference to application with DRAMs. However, it will be appreciated by the artisan that the inventive method will be applicable over other interconnecting lines, or for formation over any electrically conductive component on a wafer over which portions of a three dimensions stacked capacitor will be formed.

In compliance with the statute, the invention has been described in language more or less specific as to structural and methodical features. It is to be understood, however, that the invention is not limited to the specific features shown and described, since the means and construction herein disclosed comprise a preferred form of putting the invention into effect. The invention is, therefore, claimed in any of its forms or modifications within the proper scope of the appended claims appropriately interpreted in accordance with the doctrine of equivalents.

We claim:

1. A method of forming a capacitor on a semiconductor wafer comprising the following steps:

forming an electrically conductive interconnect line on the wafer, the interconnect line having side and top portions;

electrically isolating the substantial side and top portions of the interconnect line by forming one or more electrically insulating layers about the side and top portions;

forming a first dielectric layer over the wafer atop the substantially insulated interconnect line, the first dielectric layer having a first etch rate;

forming a second dielectric layer over the wafer atop the first dielectric layer, the second dielectric layer having a second etch rate which is slower than the first etch rate;

selectively etching contact openings through the first and second dielectric layers to align with selective active areas on the wafer;

applying an electrically conductive material atop the wafer, the electrically conductive material engaging the active areas within the contact openings;

selectively etching the applied electrically conductive material and the second dielectric layer down to the first dielectric layer to begin formation of a first terminal of a capacitor, the first capacitor terminal rising above and over the interconnect line;

forming an oxide layer atop the electrically conductive material to enable texturizing of a top of the first capacitor terminal to increase capacitance, the oxide layer having an etch rate which is slower than the first etch rate;

etching the first dielectric layer to project the first capacitor terminal above the interconnect line to expose a bottom as well as top and side portions of the first capacitor terminal above the interconnect line;

etching the oxide layer and remaining second dielectric layer from the projecting first capacitor terminal;

forming a third dielectric layer over the exposed top, bottom and side portions of the exposed and etched projecting first capacitor terminal; and applying an electrically conductive material atop the third dielectric layer to form a second terminal of the capacitor.

2. The method of forming a capacitor of claim 1 wherein the first dielectric layer consists essentially of $Si_3N_4$.

3. The method of forming a capacitor of claim 2 wherein the step of etching the first dielectric layer is conducted with an $H_3PO_4$ solution at a temperature in excess of 130° C.

4. The method of forming a capacitor of claim 1 wherein the second dielectric layer consists essentially of densified tetraethyl orthosilicate.

5. The method of forming a capacitor of claim 1 wherein,
the first dielectric layer consists essentially of $Si_3N_4$; and
the second dielectric layer consists essentially of densified tetraethyl orthosilicate.

6. The method of forming a capacitor of claim 1 wherein,
the first dielectric layer consists essentially of $Si_3N_4$;
the second dielectric layer consists essentially of densified tetraethyl orthosilicate; and
the recited electrically conductive material is everywhere conductively doped polysilicon.

7. The method of forming a capacitor of claim 1 wherein,
circuitry formed on the wafer comprises random access memory circuits, and the electrically conductive interconnect lines are digit lines;
the first dielectric layer consists essentially of $Si_3N_4$; and
the second dielectric layer consists essentially of densified tetraethyl orthosilicate.

8. The method of forming a capacitor of claim 1 further comprising forming a pair of electrically conductive interconnect lines on the wafer, the pair of interconnect lines being separated from one another by a defined distance, the first and second dielectric layers having a combined thickness which is less than the defined distance.

9. The method of forming a capacitor of claim 8 wherein,
the first dielectric layer consists essentially of $Si_3N_4$; and
the second dielectric layer consists essentially of densified tetraethyl orthosilicate.

10. The method of forming a capacitor of claim 8 wherein,
the first dielectric layer consists essentially of $Si_3N_4$;
the second dielectric layer consists essentially of densified tetraethyl orthosilicate; and
the recited electrically conductive material is everywhere conductively doped polysilicon.

11. The method of forming a capacitor of claim 1 wherein the first dielectric layer consists essentially of $Si_3N_4$, and further comprising:

forming an oxide layer on the first dielectric $Si_3N_4$ layer during the step of forming an oxide layer atop the electrically conductive material for texturizing of the top of the first capacitor terminal, the oxide layer formed on the first dielectric $Si_3N_4$ layer having a thickness which is less than a thickness of the oxide layer formed atop the electrically conductive material during such step; and etching the exposed oxide layer atop the first dielectric $Si_3N_4$ layer in a separate step preceding the step of etching the oxide layer and remaining second dielectric layer from the first capacitor terminal.

12. The method of forming a capacitor of claim 11 further comprising etching the oxide layer atop the first dielectric $Si_3N_4$ layer using a wet etch technique.

13. The method of forming a capacitor of claim 11 further comprising etching the oxide layer atop the first dielectric $Si_3N_4$ layer using a wet etch technique employing and HF solution.

14. The method of forming a capacitor of claim 11 wherein the second dielectric layer consists essentially of densified tetraethyl orthosilicate.

15. The method of forming a capacitor of claim 11 wherein,
the second dielectric layer consists essentially of densified tetraethyl orthosilicate; and
the recited electrically conductive material is everywhere conductively doped polysilicon.

16. The method of forming a capacitor of claim 11 further comprising forming a pair of electrically conductive interconnect lines on the wafer, the pair of interconnect lines being separated from one another by a defined distance, the first and second dielectric layers having a combined thickness which is less than the defined distance.

17. The method of forming a capacitor of claim 11 wherein the step of etching the first dielectric layer is conducted with an $H_3PO_4$ solution at a temperature in excess of 130° C.

18. The method of forming a capacitor of claim 1 further comprising:
forming an oxide layer on the bottom portion of the projecting first capacitor terminal to texturize such bottom portion, and thereafter etching away the oxide layer formed on the bottom portion before the step of forming a third dielectric layer over the exposed and etched projecting first capacitor terminal.

19. The method of forming a capacitor of claim 18 wherein the step of etching away the oxide layer before the step of forming the third dielectric layer comprises using a wet etch technique.

20. The method of forming a capacitor of claim 18 wherein,
the first dielectric layer consists essentially of $Si_3N_4$; and
the second dielectric layer consists essentially of densified tetraethyl orthosilicate.

21. The method of forming a capacitor of claim 18 wherein,
the first dielectric layer consists essentially of $Si_3N_4$;
the second dielectric layer consists essentially of densified tetraethyl orthosilicate; and
the recited electrically conductive material is everywhere conductively doped polysilicon.

22. The method of forming a capacitor of claim 1 wherein the first dielectric layer consists essentially of $Si_3N_4$, and further comprising:

forming an oxide layer on the first dielectric Si₃N₄ layer during the step of forming an oxide layer atop the electrically conductive material for texturizing of the top of the first capacitor terminal, the oxide layer formed on the first dielectric Si₃N₄ layer having a thickness which is less than a thickness of the oxide layer formed atop the electrically conductive material during such step;

etching the exposed oxide layer atop the first dielectric Si₃N₄ layer in a separate step preceding the step of etching the oxide layer and remaining second dielectric layer from the first capacitor terminal; and forming an oxide layer on the bottom portion of the projecting first capacitor terminal to texturize such bottom portion, and thereafter etching away the oxide layer formed on the bottom portion before the step of forming a third dielectric layer over the exposed and etched projecting first capacitor terminal.

23. The method of forming a capacitor of claim 22 wherein the second dielectric layer consists essentially of densified tetraethyl orthosilicate.

24. The method of forming a capacitor of claim 22 wherein,
the second dielectric layer consists essentially of densified tetraethyl orthosilicate; and
the recited electrically conductive material is everywhere conductively doped polysilicon.

25. The method of forming a capacitor of claim 22 further comprising forming a pair of electrically conductive interconnect lines on the wafer, the pair of interconnect lines being separated from one another by a defined distance, the first and second dielectric layers having a combined thickness which is less than the defined distance.

26. A method of forming stacked cell storage capacitors on a semiconductor wafer comprising an array of random access memory cells, the method comprising the following sequential steps:
forming digit lines on the wafer, the digit lines having side and top portions, the digit lines being separated from adjacent digit lines by a defined distance;
electrically isolating the substantial side and top portions of the digit lines by forming one or more electrically insulating oxide layers about the digit lines side and top portions;
forming a layer of Si₃N₄ over the wafer atop the substantially insulated digit lines;
forming a layer of densified tetraethyl orthosilicate over the wafer atop the layer of Si₃N₄, the layer of densified tetraethyl orthosilicate having an etch rate which is slower than an etch rate of the Si₃N₄, the layer of densified tetraethyl orthosilicate and layer of Si₃N₄ having a combined thickness which is less than the defined distance between adjacent digit lines;
selectively etching contact openings through the Si₃N₄ layer and the densified tetraethyl orthosilicate layer to alin with selective active areas of MHOS transistors on the wafer;
applying electrically conductive doped polysilicon atop the wafer, doped polysilicon engaging the MHOS transistor active areas within the contact openings;
selectively etching the applied doped polysilicon and densified tetraethyl orthosilicate down to the layer of Si₃N₄ to begin formation of first terminals of the capacitors, the first capacitor terminals rising from between adjacent pairs of digit lines to extend above and over two digit lines;
forming oxide layers atop the doped polysilicon and Si₃N₄ layers, the oxide layers having an etch rate which is slower than the etch rate of the Si₃N₄;
etching away the exposed layer of oxide atop the Si₃N₄ layer;
etching the Si₃N₄ layer to project the first capacitor terminals above respective adjacent pairs of digit lines to expose a bottom as well as top and side portions of the first capacitor terminals above the respective adjacent pairs of digit lines;
etching the oxide layer and Si₃N₄ layer from the doped polysilicon of the projecting first capacitor terminals to effectively texturize the top portion of the first capacitor terminals;
forming an oxide layer on the bottom portion of the projecting first capacitor terminals, and thereafter etching away the oxide layer from the first capacitor terminals to effectively texturize the bottom portion of the first capacitor terminals;
forming a dielectric layer of Si₃N₄ over the exposed top, bottom and side portions of the exposed and etched projecting first capacitor terminals;
applying electrically conductive doped polysilicon atop the layer of Si₃N₄; and
etching the doped polysilicon layer to form a second terminal of the capacitor.

27. A method of forming a capacitor on a semiconductor wafer comprising the following steps:
forming an electrically conductive component on the wafer, the component having a top portion;
electrically isolating at least part of the top portion of the component by forming one or more electrically insulating layers above at least part of the top portion;
forming a first dielectric layer over the wafer atop the top portion of the component, the first dielectric layer having a first etch rate;
forming a second dielectric layer over the wafer atop the first dielectric layer, the second dielectric layer having a second etch rate which is slower than the first etch rate;
selectively etching contact openings through the first and second dielectric layers to align with selective active areas on the wafer;
applying an electrically conductive material atop the wafer, the electrically conductive material engaging the active areas within the contact openings;
selectively etching the applied electrically conductive material and the second dielectric layer down to the first dielectric layer to begin formation of a first terminal of a capacitor, the first capacitor terminal rising above and over the component;
forming an oxide layer atop the electrically conductive material to enable texturizing of a top of the first capacitor terminal to increase capacitance, the oxide layer having an etch rate which is slower than the first etch rate;
etching the first dielectric layer to project the first capacitor terminal above the component to expose a bottom as well as top and side portions of the first capacitor terminal above the component;
etching the oxide layer and remaining second dielectric layer from the projecting first capacitor terminal;
forming a third dielectric layer over the exposed top, bottom and side portions of the exposed and etched projecting first capacitor terminal; and
applying an electrically conductive material atop the third dielectric layer to form a second terminal of the capacitor.

* * * * *